(12) United States Patent
Yamabe

(10) Patent No.: US 8,558,358 B2
(45) Date of Patent: Oct. 15, 2013

(54) LEAD FRAME

(75) Inventor: Naoki Yamabe, Nagano-ken (JP)

(73) Assignee: Shinko Electric Industries Co., Ltd. (JP)

( * ) Notice: Subject to any disclaimer, the term of this patent is extended or adjusted under 35 U.S.C. 154(b) by 0 days.

(21) Appl. No.: 13/418,770

(22) Filed: Mar. 13, 2012

(65) Prior Publication Data

US 2012/0248588 A1 Oct. 4, 2012

(30) Foreign Application Priority Data

Mar. 28, 2011 (JP) .................................. 2011-070379

(51) Int. Cl.
*H01L 23/495* (2006.01)
(52) U.S. Cl.
USPC .... 257/666; 257/670; 257/676; 257/E23.031; 257/E23.05
(58) Field of Classification Search
USPC .................. 257/666–677, E23.031–E23.059, 257/E23.004, E23.043–E23.05; 438/111, 438/112, 123, FOR. 366, FOR. 367, 438/FOR. 377, FOR. 380; 428/643–685
See application file for complete search history.

(56) References Cited

U.S. PATENT DOCUMENTS

| | | | | |
|---|---|---|---|---|
| 3,839,782 A | * | 10/1974 | Lincoln | 438/25 |
| 7,808,086 B2 | * | 10/2010 | Saiki et al. | 257/669 |
| 2012/0223423 A1 | * | 9/2012 | Hsu et al. | 257/676 |

FOREIGN PATENT DOCUMENTS

| | | |
|---|---|---|
| JP | 4-337659 | 11/1992 |
| JP | 5-326800 | 12/1993 |
| JP | 6-252319 | 9/1994 |

* cited by examiner

*Primary Examiner* — Jasmine Clark
(74) *Attorney, Agent, or Firm* — Fish & Richardson P.C.

(57) ABSTRACT

A lead frame including rails, section bars, and lead frame cells. The rails are respectively arranged at edges of the lead frame extending in a first direction. The section bars extend between the rails in a second direction and are orthogonal to the rails. The lead frame cells are aligned along the section bars. At least one of the section bars includes a rib extending in the second direction and formed through a half blanking process.

7 Claims, 3 Drawing Sheets

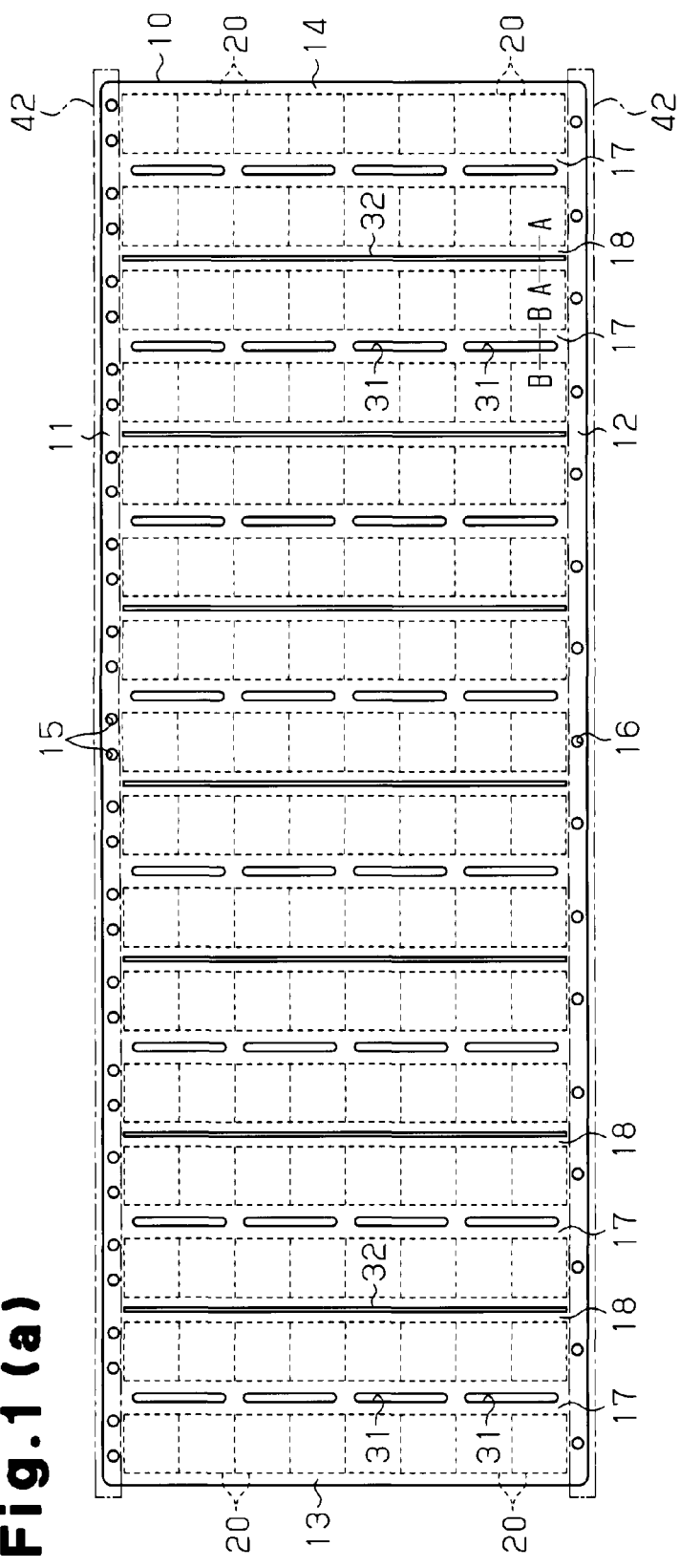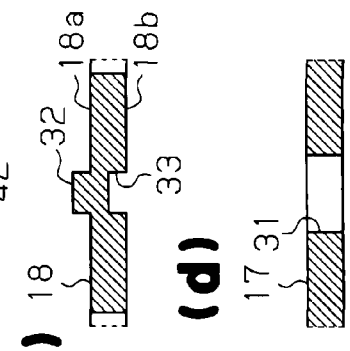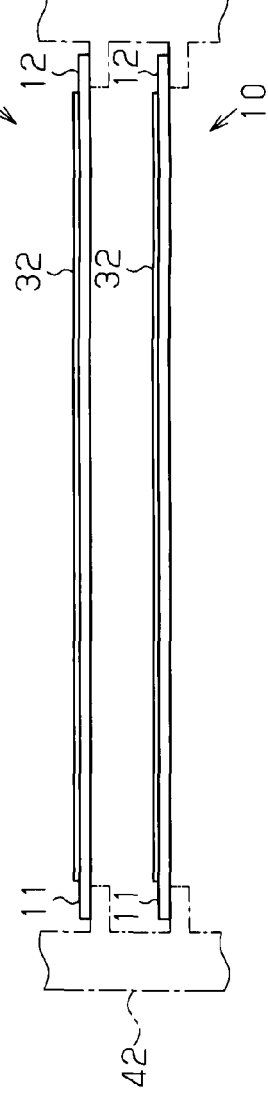

LEAD FRAME

CROSS-REFERENCE TO RELATED APPLICATIONS

This application is based upon and claims the benefit of priority from prior Japanese Patent Application No. 2011-070379, filed on Mar. 28, 2011, the entire contents of which are incorporated herein by reference.

BACKGROUND

The present invention relates to a lead frame.

Semiconductor devices are manufactured by mounting semiconductor elements on die pads of a lead frame, electrically connecting electrodes of the semiconductor elements to leads of the lead frame with bonding wires, and sealing the semiconductor elements and bonding wires with a sealing resin mold. The lead frame is formed from a rectangular thin metal plate. Thus, there is a tendency for the lead frame to deform or sag when the semiconductor devices are being assembled and manufactured. To reduce deformation or sagging of the lead frame, a drawing process may be performed on the lead frame to form ribs. Alternatively, a bending or coining process may be performed to harden the lead frame. Japanese Laid-Open Patent Publication Nos. 6-252319, 5-326800, and 4-337659 describe examples of such techniques.

SUMMARY

To increase productivity of the semiconductor devices, a single lead frame includes a plurality of lead frame cells. Lead frame cell lines, each including a plurality of the lead frame cells, are arranged between and parallel to rails, which are formed on both edges of the lead frame and extend in a length direction of the lead frame. There is a tendency in the number of lead frame cell lines between the rails to increase and a tendency in lead frame cells to be arranged with higher integration. These tendencies decrease the proportion of metal areas in a lead frame. Further, the number of components mounted on a lead frame also has a tendency to increase. Thus, there is a tendency in a lead frame to sag downward in a vertical direction of the lead frame. When a plurality of lead frames are accommodated in a magazine, a middle portion of a short side of each lead frame may droop. This may result in contact between lead frames that are adjacent to each other in the vertical direction.

It is an object of the present invention to provide a lead frame that reduces sagging in the vertical direction of the lead frame.

One aspect of the present invention is a lead frame including rails arranged at both edges of the lead frame and extending in a first direction (a length direction). A plurality of section bars each extend between the rails in a second direction (a width direction) and are orthogonal to the rails. A plurality of lead frame cells are aligned along the section bars. At least one of the section bars includes a rib extending in the second direction and formed through a half blanking process.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory and are not restrictive of the invention, as claimed.

BRIEF DESCRIPTION OF THE DRAWINGS

The invention, together with objects and advantages thereof, may best be understood by reference to the following description of the presently preferred embodiments together with the accompanying drawings in which:

FIG. 1(a) is a plan view showing a lead frame according to one embodiment of the present invention;

FIG. 1(b) is a side view showing the lead frame of FIG. 1(a) accommodated in a magazine;

FIG. 1(c) is a cross-sectional view of a half-blanked portion of the lead frame taken along line A-A in FIG. 1(a);

FIG. 1(d) is a cross-sectional view of the lead frame taken along line B-B in FIG. 1(a);

DESCRIPTION OF THE EMBODIMENTS

Figure 2A:
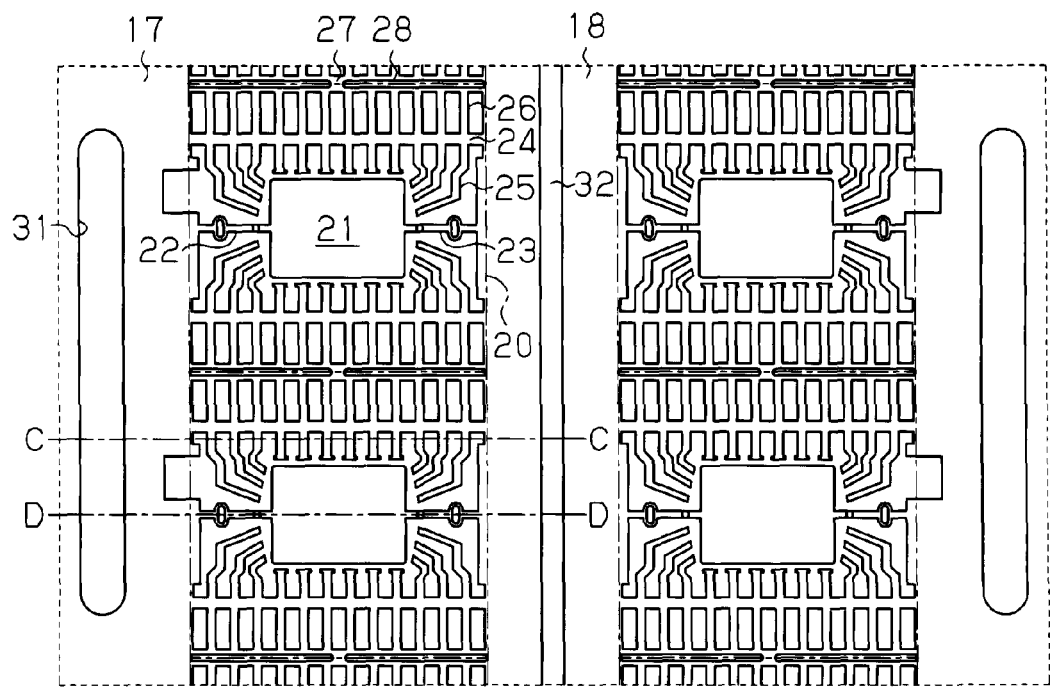
FIG. 2(a) is a partially enlarged view showing the lead frame of FIG. 1(a)

One embodiment of a lead frame will now be described with reference to FIGS. 1 and 2. The accompanying drawings schematically show structures and are not in scale with the actual size.

FIG. 1(a) shows a lead frame 10, which is a rectangular plate. The lead frame 10 is formed by a pressing machine, which punches out the lead frame 10 from a sheet of conductive material. The conductive material may be, for example, copper (Cu), a Cu-based alloy, a nickel-iron (Fe-Ni) binary alloy, or a Fe-Ni based alloy.

The lead frame 10 includes two rails 11 and 12, which are formed on both edges. The rails 11 and 12 extend in a length direction, or a first direction, of the lead frame 10. Further, the lead frame 10 includes two end bars 13 and 14, which are formed on both ends. The end bars 13 and 14 extend in a width direction, or a second direction, of the lead frame 10, that is, a direction orthogonal to the direction in which the rails 11 and 12 extend. Guide holes 15 and 16 respectively extend through the rails 11 and 12. The guide holes 15 and 16 are used to position or convey the lead frame 10.

A plurality of section bars 17 and 18 extend in the width direction of the lead frame 10 and connect the rails 11 and 12. The section bars 17 and 18 are orthogonal to the rails 11 and 12. The first section bars 17 and second section bars 18 are alternately arranged in the length direction of the lead frame 10.

A plurality of (eight in FIG. 1(a)) lead frame cells 20 are aligned in the width direction of the lead frame 10 in each area between the section bars 17 and 18 and in each area between each of the end bars 13 and 14 and each of the adjacent bars 17, respectively.

As shown in FIG. 2(a), each lead frame cell 20 includes a die pad 21, which is arranged in a central part of the lead frame cell 20. The die pad 21 is connected to the adjacent first section bar 17 by a support bar 22 and the adjacent second section bar 18 by a support bar 23. Inner leads 25, which are connected to a dam bar 24, are arranged around the die pad 21.

Figure 2B:
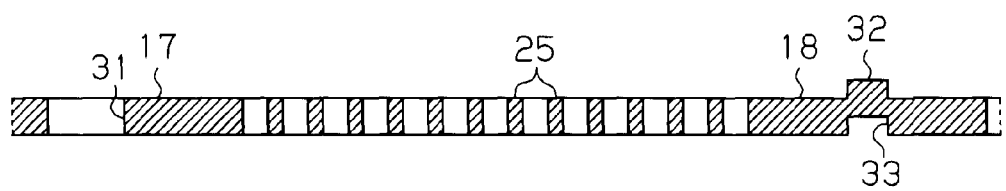
FIG. 2(b) is a cross-sectional view of the lead frame taken along line C-C in FIG. 2(a)
Figure 2C:
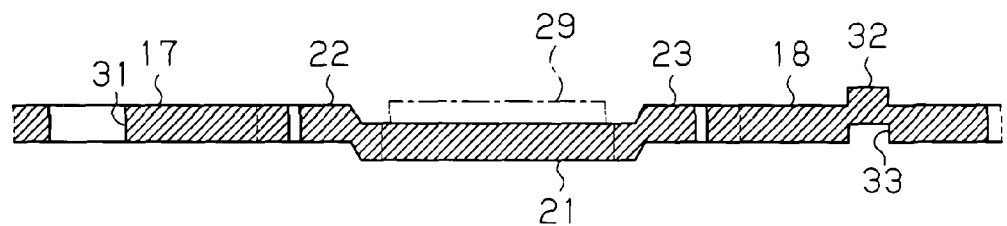
FIG. 2(c) is a cross-sectional view of the lead frame taken along line D-D in FIG. 2(a)

Each dam bar 24 is connected to basal ends of outer leads 26. Distal ends of the outer leads 26 are connected to an inner frame 27, which is arranged between the first section bar 17 and the second section bar 18. Each inner frame 27 includes a plurality of slits 28 extending in the length direction of the inner frame 27. Referring to FIGS. 2(b) and 2(c), the support bars 22 and 23 are bent so that the die pad 21 is lower then the inner leads 25. The bent support bars 22 and 23 facilitate connection between the inner leads 25 and electrodes of a semiconductor element 29, which is mounted on the die pad 21.

As shown in FIG. 1(a), each first section bar 17 includes a plurality of (four in FIG. 1(a)) slits 31, which extend in the length direction of the section bar 17, that is, the width direction of the lead frame 10. The slits 31 of each first section bar 17 are formed in a single line in the width direction of the lead frame 10. As shown in FIG. 1(d), each slit 31 is a through hole extending between an upper surface and lower surface of the first section bar 17. The slits 31 reduce the stress that is produced when the components of the lead frame cells 20 (die pads 21, leads 25 and 26, and the like) are punched out.

Figure 3:
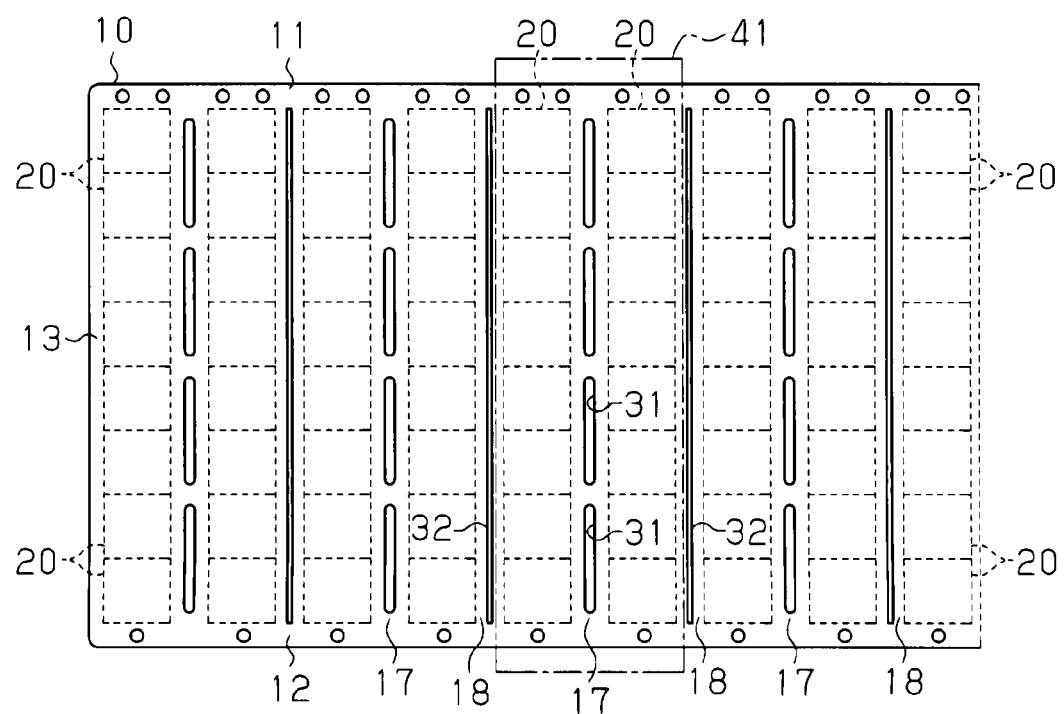
FIG. 3 is a partially enlarged view of the lead frame and illustrates a sealing resin molding process.

The slits 31 function as gates or ports that supply each lead frame cell 20 with a sealing resin. For example, referring FIG. 3, the lead frame 10 is arranged in a molding device, which includes a mold 41 set so that the first section bar 17 lies along the middle of the mold 41. In this state, a sealing resin is supplied from, for example, each slit 31 to four lead frame cells 20 in the mold 41 to form a resin mold.

As shown in FIG. 1(a), a rib 32, which extends in the width direction of the lead frame 10, is formed on each second section bar 18. The rib 32 is arranged at the middle portion of the second section bar 18 with respect to the width direction of the section bar 18. As shown in FIG. 1(c), the rib 32 is formed so as to project from an upper surface 18a of the second section bar 18. A half blanking process is performed to form the rib 32 when the lead frame 10 is pressed. The half blanking process is also referred to as a half piercing process or half cutting process. When performing the half blanking process, a punch and die are used to shear a work piece, which is used to form the lead frame 10, in a thicknesswise direction without completely punching the work piece. This forms a step in the work piece. Accordingly, the thickness of the portion that is downwardly pressed during the half blanking process is substantially the same as that of the original work piece. In the illustrated example, a groove or recess 33 shaped in conformance with the rib 32 is formed in a lower surface 18b of the second section bar 18. In other words, the height of the rib 32, which projects from the upper surface 18a of the second section bar 18, is substantially equal to the depth of the recess 33, which is formed in the lower surface 18b. Further, the sheared surfaces formed by the half blanking, that is, the side surfaces of the rib 32, and corresponding inner surfaces of the recess 33 are substantially aligned in the thicknesswise direction of the lead frame 10. Accordingly, the rib 32 and the recess 33 have substantially the same width.

In the second section bar 18, the rib 32 is formed throughout the entire length of the section bar 18. However, the rib 32 may be shorter than the section bar 18 in order for the lead frame 10 not to contact the adjacent lead frame 10 in a state accommodated in the magazine 42 when the lead frame 10 may sag in the thicknesswise direction due to a stress caused by the half blanking. For example, ribs 32 may extend from the middle portion of the lead frame 10 in the width direction toward the rails 11 and 12. In this case, each rib 32 has a length less than one-half the width of the lead frame 10. The rib 32 has, for example, a width that is set to 0.2 to 0.3 mm when the lead frame 10 has a thickness of 0.127 mm. The lead frame 10 has a width of, for example, 70 to 90 mm.

Due to the rib 32, the second section bar 18 resists sagging in the vertical direction of the section bar 18. That is, the rib 32 of the second section bar 18 reduces sagging in the vertical direction of the lead frame 10. Accordingly, referring to FIG. 1(b), the rib 32 reduces the sagging of the lead frame 10, which is accommodated in the magazine 42. As a result, in the magazine 42 that stacks lead frames 10 in the vertical direction, contact between lead frames 10 is prevented.

During the half blanking process, the punching force of the pressing machine is applied in a thicknesswise direction of the second section bar 18 (vertical direction as viewed in FIG. 1(c)). Thus, when forming the rib 32, the area affected by the stress produced (along line A-A) is smaller compared to when a drawing process or coining process is performed. Further, the rib 32 is formed through the half blanking process that reduces changes in the length of the lead frame 10. This is effective for reducing a variation of the length of the lead frame 10. The portion (FIG. 1(c)) including the rib 32 and the recess 33 and extending substantially the entire length of the section bar 18 may be referred to as an elongated half-blanked portion.

The present embodiment has the advantages described below.

(1) The lead frame 10 includes the ribs 32, which extend in the width direction of the lead frame 10. This increases the rigidity of the lead frame 10 in the width direction and reduces bending and sagging in the vertical direction of the lead frame 10.

(2) The ribs 32 are formed on the second section bars 18 that connect the rails 11 and 12, which are arranged at both edges of the lead frame 10. The lead frame cells 20 of the lead frame 10 are set to the mold 41 in a state in which the first section bar 17, which includes the slits 31, is arranged at the middle portion of the mold 41. Thus, the ribs 32 formed in the second section bars 18 do not affect other processes. In this manner, bending or sagging of the lead frame 10 in the vertical direction can be reduced without affecting other processes.

(3) The half blanking process is performed to form the ribs 32 on the section bars 18. The half blanking process may be performed by a pressing machine that forms the die pads 21 of the lead frame cells 20. For example, the ribs 32 may be formed at the same time as when the lead frame cells 20 and the slits 31 are formed. This reduces the manufacturing time of the lead frame 10.

It should be apparent to those skilled in the art that the present invention may be embodied in many other specific forms without departing from the spirit or scope of the invention. Particularly, it should be understood that the present invention may be embodied in the following forms.

The length, width, and number of the ribs 32 may be changed as required. For example, a plurality of ribs 32 can be aligned in the width direction of the lead frame 10.

In the above embodiment, the ribs 32 project from the upper surfaces 18a of the second section bar 18. Instead, the ribs 32 may project from the lower surfaces 18b of the second section bar 18.

The lead frame 10 of the above embodiment is provided with a plurality of the first section bars 17, which includes the slits 31, and a plurality of the second section bars 18, which includes the ribs 32. However, the number of the second section bars 18 that include the ribs 32 only needs to be one or more. Further, the number of the first section bars 17 that include the slits 31 only needs to be one or more. For example, the lead frame 10 may be provided with one or more first section bars 17, which include the slits 31, one or more second section bars 18, which include the ribs 32, and a third section bar, which does not include a slit 31 and a rib 32.

FIG. 2(*a*) shows only one example of the shapes of the lead frame cells 20. For instance, the lead frame may form a semiconductor device of an area array type, such as a ball grid array (BGA) or a Land grid array (LGA), a quad flat non-leaded package (QFN) type, or a chip size package (CSP) type.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

The invention claimed is:

1. A lead frame comprising:
   rails arranged at both edges of the lead frame and extending in a first direction;
   a plurality of section bars each extending between the rails in a second direction, which are orthogonal to the rails; and
   a plurality of lead frame cells aligned along the section bars;
   wherein at least one of the section bars includes a rib and a recess opposite to the rib that extend in the second direction, wherein the rib and the recess have substantially a same width.

2. The lead frame according to claim 1, wherein the plurality of section bars include
   a plurality of first section bars each including a slit extending in the second direction and formed through a punching process, and
   a plurality of second section bars each including the rib extending in the second direction and formed through the half blanking process,
   wherein the first and second section bars are alternately arranged in the first direction.

3. The lead frame according to claim 2, wherein
   the plurality of lead frame cells form a plurality of lead frame cell lines extending in the second direction,
   each first section bar is arranged between two adjacent first ones of the plurality of lead frame cell lines, and
   each second section bar is arranged between two adjacent second ones of the plurality of lead frame cell lines.

4. The lead frame according to claim 1, wherein
   at least one of the plurality of section bars includes a first surface and an opposite second surface,
   the rib projects from the first surface of the at least one of the plurality of section bars, and
   the second surface of the at least one of the plurality of section bars includes the recess shaped in conformance with the rib.

5. The lead frame according to claim 1, wherein the height of the rib is substantially equal to the depth of the recess.

6. A lead frame comprising:
   a pair of edges each extending in a length direction of the lead frame;
   a pair of rails respectively formed on both edges and extending in the length direction;
   a plurality of section bars each extending in a width direction of the lead frame and connecting the pair of rails; and
   a plurality of lead frame cells aligned in areas between the plurality of section bars;
   wherein at least one of the section bars includes a rib and a recess opposite to the rib that extend substantially the entire length of the at least one of the section bars to reduce sagging in the vertical direction of the lead frame, wherein the rib and the recess have substantially a same width.

7. The lead frame according to claim 6, wherein the height of the rib is substantially equal to the depth of the recess.

* * * * *